United States Patent
Leong

(10) Patent No.: US 9,941,890 B2
(45) Date of Patent: Apr. 10, 2018

(54) PHASE-LOCKED LOOPS WITH ELECTRICAL OVERSTRESS PROTECTION CIRCUITRY

(71) Applicant: Altera Corporation, San Jose, CA (US)

(72) Inventor: Chee Seng Leong, Bayan Lepas (MY)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 15/187,534

(22) Filed: Jun. 20, 2016

(65) Prior Publication Data
US 2017/0366190 A1    Dec. 21, 2017

(51) Int. Cl.
| | |
|---|---|
| H03L 7/06 | (2006.01) |
| H03L 7/08 | (2006.01) |
| H03L 7/099 | (2006.01) |
| H03L 7/089 | (2006.01) |
| H03L 7/091 | (2006.01) |

(52) U.S. Cl.
CPC .......... H03L 7/0807 (2013.01); H03L 7/0891 (2013.01); H03L 7/091 (2013.01); H03L 7/0995 (2013.01)

(58) Field of Classification Search
CPC ..... H03L 7/089; H03L 7/0891; H03L 7/0893; H03L 7/0895; H03L 7/0896; H03L 7/0898; H03L 7/0807; H03L 7/081; H03L 7/0812; H03L 7/0814; H03L 7/0816; H03L 7/0818; H03L 7/091; H03L 7/095; H03L 7/097; H03L 7/0995; H03L 7/0996; H03L 7/0997; H03L 7/0998

USPC ..................................................... 327/157
See application file for complete search history.

(56) References Cited

U.S. PATENT DOCUMENTS

| | | | |
|---|---|---|---|
| 4,931,748 A | 6/1990 | McDermott et al. | |
| 5,710,527 A | 1/1998 | Yaguchi et al. | |
| 5,886,551 A * | 3/1999 | Narahara | H03L 7/0895 327/156 |
| 6,177,843 B1 * | 1/2001 | Chou | H03L 7/105 327/156 |
| 6,426,680 B1 | 7/2002 | Duncan et al. | |
| 6,963,110 B2 | 11/2005 | Woo et al. | |
| 6,968,157 B2 | 11/2005 | Iliadis | |
| 7,115,952 B2 | 10/2006 | Woo et al. | |
| 7,417,303 B2 | 8/2008 | Woo et al. | |
| 7,687,858 B2 | 3/2010 | Woo et al. | |
| 7,692,247 B2 | 4/2010 | Woo et al. | |

(Continued)

*Primary Examiner* — Patrick Chen
(74) *Attorney, Agent, or Firm* — Treyz Law Group, P.C.; Jason Tsai

(57) ABSTRACT

An integrated circuit with a phase-locked loop (PLL) is provided. The PLL may include a phase frequency detector, a charge pump, a source follower circuit, a variable oscillator, a frequency divider, and a control block. The phase frequency detector may be configured to align or lock a feedback clock signal to a reference clock signal. The control block includes clock loss detection circuits that are used to determine whether the reference clock signal or the feedback clock signal has stopped toggling. In response to detecting a clock loss event for either the reference or the feedback clock signal, the control block may disable the phase frequency detector to place the charge pump in a tristate mode and may apply a predetermined bias voltage to the source follower circuit to help minimize electrical overstress.

17 Claims, 7 Drawing Sheets

(56) References Cited

U.S. PATENT DOCUMENTS

| | | | |
|---|---|---|---|
| 7,863,991 B1 * | 1/2011 | Iravani | H03K 3/0322 |
| | | | 331/177 R |
| 8,035,162 B2 | 10/2011 | Woo et al. | |
| 8,405,152 B2 | 3/2013 | Woo et al. | |
| 9,209,819 B2 | 12/2015 | Tang et al. | |
| 2002/0057135 A1 | 5/2002 | Sun et al. | |
| 2007/0285154 A1 * | 12/2007 | Darabi | H03B 21/01 |
| | | | 327/551 |
| 2009/0273371 A1 | 11/2009 | Atsumi | |
| 2010/0197349 A1 | 8/2010 | Morita et al. | |
| 2014/0084974 A1 * | 3/2014 | Tang | H03L 7/0995 |
| | | | 327/154 |

* cited by examiner

PHASE-LOCKED LOOPS WITH ELECTRICAL OVERSTRESS PROTECTION CIRCUITRY

BACKGROUND

This relates generally to integrated circuits and more particularly, to integrated circuits with phase-locked loops.

A phase-locked loop is commonly used in radio, telecommunications, computers, and other electronic applications to generate an output clock signal whose phase is related or "locked" to the phase of an input clock signal. In general, a phase-locked loop (PLL) includes a phase detector and a voltage-controlled oscillator. The oscillator generates a periodic signal. The phase detector compares the phase of that periodic signal with the phase of the input clock signal and then adjusts the oscillator to keep the phases in sync. Operated in this way, the phase-locked loop also keeps the frequencies of the input and output clock signals matched or at least proportional to one another.

A phase-locked loop generally has limited control over the availability of the input clock source. For example, the input clock might stop toggling after some time due to latency issues or some unintentional clock gating. For a charge-pump-based PPL (i.e., a PLL that uses a charge pump to directly control the voltage-controlled oscillator), this clock loss event could present a problem when the charge pump continues to charge or discharge beyond a desired operating voltage range. Under such scenarios, the voltage-controlled oscillator, which is typically designed using thin-gate oxide transistors, will be susceptible to electrical overstress.

In an effort to improve reliability and to protect against this type of electrical overstress, voltage-controlled oscillators are sometimes designed using native thick-gate oxide transistors with zero threshold voltage. Thick-gate oxide transistors with zero threshold voltage are able to withstand high levels of electrical overstress while maintaining operation in the saturation mode.

However, it may not always be possible or feasible to include thick-gate oxide devices on an integrated circuit. Forming thick-gate oxide transistors requires additional processing steps at the foundry and increases cost. It is within this context that the embodiments herein arise.

SUMMARY

An integrated circuit with a phase-locked loop is provided. The phase-locked loop (PLL) may include at least a phase frequency detector, a charge pump, a source follower circuit, and a variable oscillator coupled in a loop. In accordance with an embodiment, the PLL may include a control block that selectively deactivates the phase frequency detector in response to detecting a clock loss event.

In particular, the phase frequency detector may receive a reference clock signal and a feedback clock signal. The control block may also receive the reference clock signal and the feedback clock signal. In addition, the control block may further receive a sampling clock signal. The control block may be used to determine when the reference clock signal has stopped toggling or when the feedback clock signal has stopped toggling.

When the control block deactivates the phase frequency detector, the charge pump can be placed in a tristate mode such that a pull-up switch and a pull-down switch within the charge pump are both in the off state. Moreover, the source follower circuit may include a source follower transistor. The source follower transistor has a gate terminal that typically receives a voltage from the charge pump. When the charge pump is in the tristate mode, however, the source follower transistor may receive a predetermined bias voltage at its gate to minimize electrical overstress via a separate switch that is also controlled by the control block.

The control block may include a first clock loss detector circuit for monitoring the reference clock and a second clock loss detector circuit that is structurally identical to the first clock loss detector circuit for monitoring the feedback clock. The control block may also include a logic OR gate that receives output signals from the first and second clock loss detector circuits.

The first clock loss detector circuit may include a first flip-flop for generating first reset pulses in response to rising edges in the reference clock, a first chain of flip-flops for generating second reset pulses corresponding to rising edges in the sampling clock, and a first multiplexer having inputs coupled to different tap points along the first chain of flip-flops. Similarly, the second clock loss detector circuit may include a second flip-flop for generating third reset pulses in response to rising edges in the feedback clock, a second chain of flip-flops for generating fourth reset pulses corresponding to rising edges in the sampling clock, and a second multiplexer having inputs coupled to different locations along the second chain of flip-flops.

Further features of the present invention, its nature and various advantages will be more apparent from the accompanying drawings and the following detailed description.

DETAILED DESCRIPTION

The present embodiments provide an integrated circuit having a phase-locked loop (PLL) that can be designed without a native thick-gate oxide. In particular, the phase-locked loop may include a digital PLL control block that consumes relatively low power, does not require much area overhead, and can easily be ported from one process node to another. The digital PLL control block may be configured to detect for a clock loss event and may further be configured to, in response to detecting a clock loss event, output a control signal that breaks the PLL feedback loop and that applies a fixed bias voltage to a variable oscillator in the PLL to help prevent electrical overstress.

Figure 1:
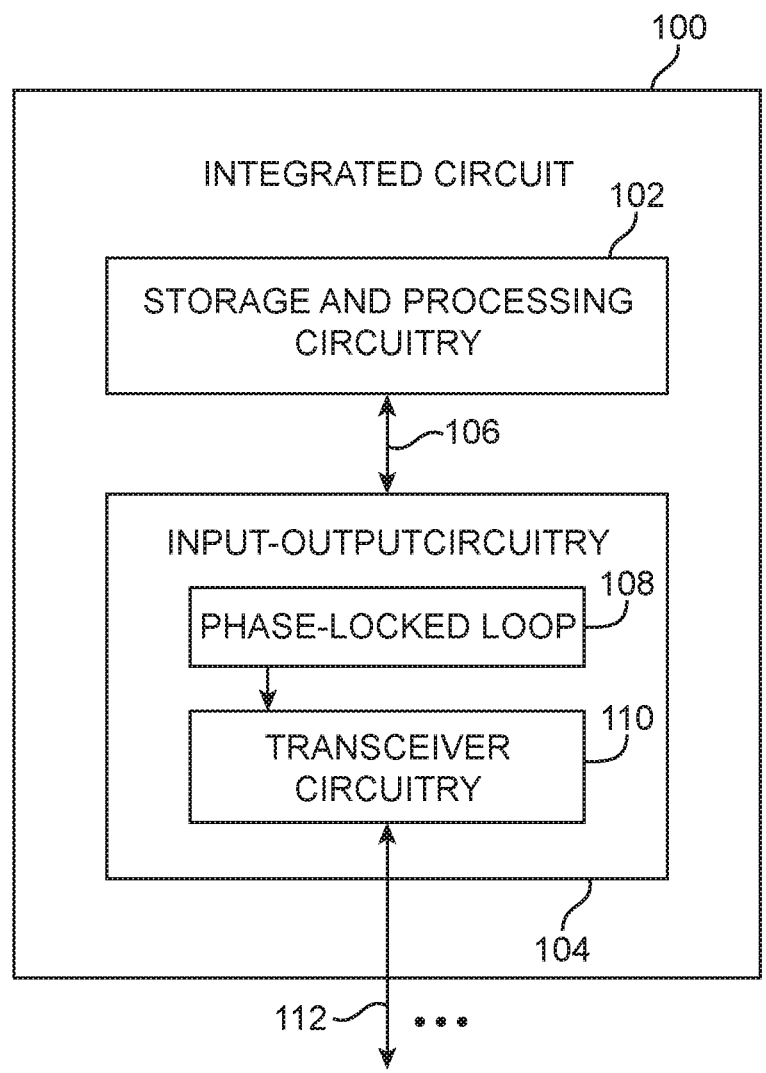
FIG. 1 a diagram of an illustrative integrated circuit that includes input-output circuitry in accordance with an embodiment.

An illustrative embodiment of an integrated circuit that may include such a PLL in accordance with the present invention is shown in FIG. 1. As shown in FIG. 1, integrated circuit die 100 may include storage and processing circuitry 102 and input-output (IO) circuitry 104. Storage and processing circuitry 102 may include embedded microprocessors, digital signal processors (DSP), arithmetic circuitry, logic circuitry, microcontrollers, or other processing circuitry. The storage and processing circuitry 102 may further include random-access memory (RAM), first-in first-out (FIFO) circuitry, stack or last-in first-out (LIFO) circuitry, read-only memory (ROM), or other memory elements. Internal interconnection resources 106 such as conductive lines and busses may be used to send data from one component to another component or to broadcast data from one component to one or more other components within device 100. External interconnection resources 112 such as conductive lines and busses, optical interconnect infrastructure, or wired and wireless networks with optional intermediate switches may be used to communicate with other devices.

Input-output circuitry 104 may, for example, be a high-speed serial interface (or HSSI) circuit that receive serial data from external interconnection resources 112 and that deserializes the serial data before sending parallel data over internal interconnection resources 112 to storage and processing circuitry 102. Interface circuitry 104 may also receive data from storage and processing circuitry 102 over internal interconnection resources 106, serialize the received data, and transmit the serial data over external interconnection resources 112.

Input-output circuitry 104 may include differential buffer circuitry, transceiver circuitry 110 such as receive (Rx) and transmit (Tx) channels and one or more associated phase-locked loop (PLL) circuits 108, and/or other suitable communications circuitry for transmitting and receiving data. Phase-locked loop circuits 108 may be used to generate clock signals for clocking one or more buffers within the Tx/Rx channels in transceiver circuitry 110. Input-output circuitry 104 may also be provided with physical media attachment (PMA) layer circuitry which may include one or more Rx/Tx channels for receiving and transmitting data. Each channel may have a serializer/deserializer (SerDes), pre-emphasis and equalization circuitry, or clock data recovery (CDR) circuitry. Each channel may optionally include physical coding sublayer (PCS) circuitry which may include word aligner circuitry, rate matching first-in first-out circuitry, 8 bit/10 bit encoding and decoding circuitry, etc.

The example described herein where IC circuitry 104 is used to support high speed serial communications is merely illustrative and does not serve to limit the scope of the present invention. If desired, IC circuitry 104 may be used to support parallel data transmission, single-data-rate communications, double-data-rate communications, single-ended-signaling standards, differential-signaling standards, standard-voltage communications protocols, low-voltage communications protocols, etc.

Figure 2:
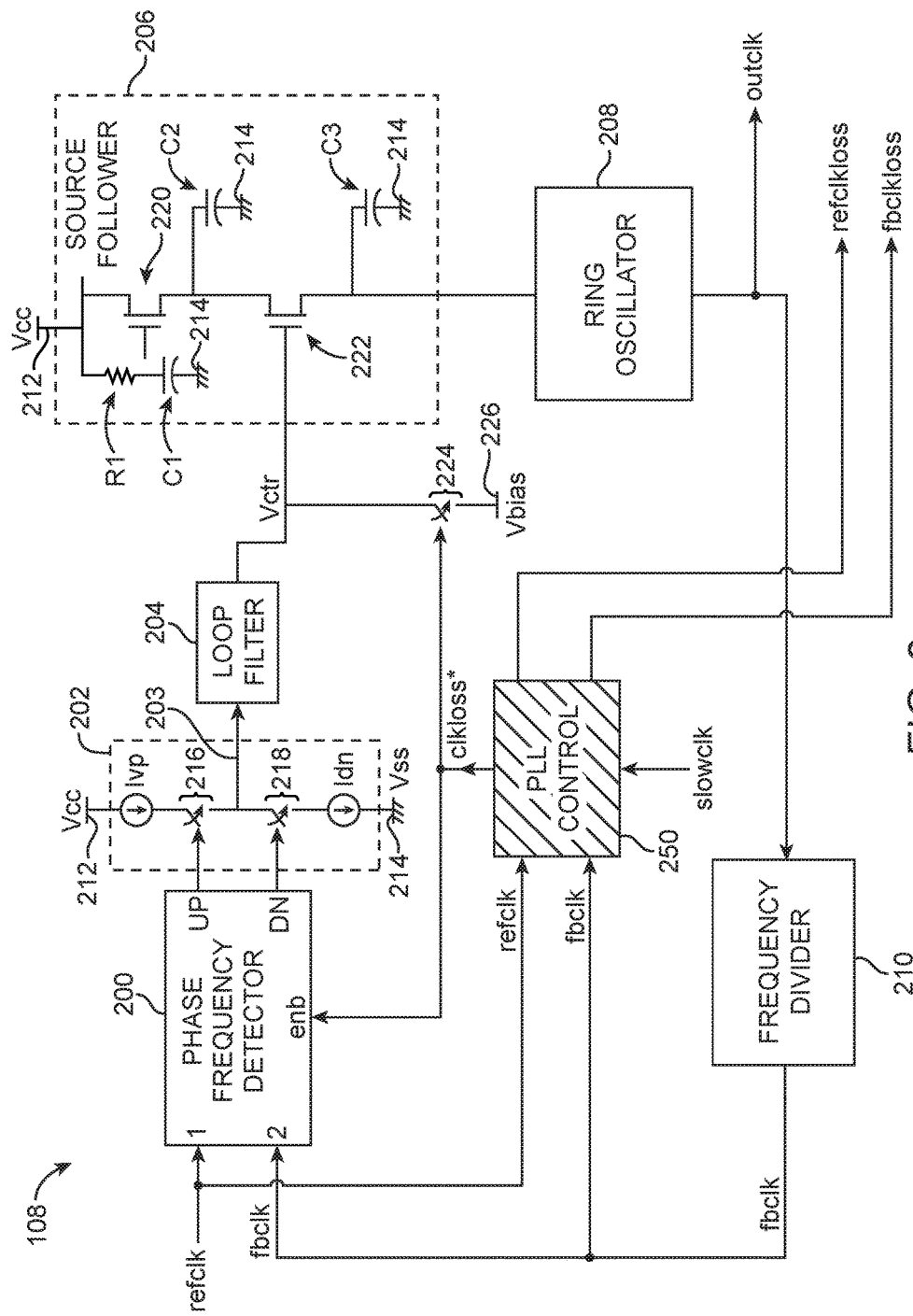
FIG. 2 is a diagram of a phase-locked loop (PLL) with illustrative with an illustrative PLL control block for detecting a clock loss event in accordance with an embodiment.

FIG. 2 is a diagram of an illustrative phase-locked loop circuit such as PLL 108 in accordance with an embodiment. As shown in FIG. 2, PLL 108 may include a phase frequency detector circuit such as phase frequency detector (PFD) 200, a charge pump circuit such as charge pump 202, a loop filter circuit such as loop filter 204, a source follower circuit such as source follower 206, a variable oscillator circuit such as ring oscillator (RO) 208, and a frequency divider circuit such as frequency divider 210.

Phase frequency detector 200 may have a first input that receives a reference clock signal refclk and a second input that receives a feedback clock signal fbclk. Signal refclk may generally be generated off-chip by an oscillator such as a crystal oscillator. Phase frequency detector may compare signal refclk with signal fbclk and generate corresponding up/down signals for charge pump 202. For example, if signal refclk is leading signal fbclk, the up output (UP) may be asserted. On the other hand, if signal refclk is trailing signal fbclk, the down (DN) output may be asserted.

The up/down control signals may direct charge pump 202 to generate a higher or lower voltage on its output line 203. When output UP is asserted, pull-up switch 216 in charge pump 202 may be turned on so that current source Iup is used to pull output line 203 up towards positive power supply Vcc (e.g., a positive power supply voltage provided on power supply line 212). When output DN is asserted, pull-down switch 218 in charge pump 202 may instead by enabled so that current sink Idn is used to pull output line 203 down towards ground power supply Vss (e.g., a ground power supply voltage provided on ground line 214). The output voltage generated by charge pump 202 at line 203 can optionally be filtered using loop filter 204 to produce control voltage Vctr.

Control voltage Vctr may be received using source follower circuit 206. Source follower circuit 206 may include n-channel transistors 220 and 222, resistor R1, and capacitors C1, C2, and C3. Transistors 220 and 222 may be coupled in series between positive power supply line 212 and ring oscillator 208. In particular, transistor 220 may have a gate terminal that is coupled to power line 212 via resistor R1 and that is coupled to ground line 214 via capacitor C1. Transistor 222 may have a drain terminal that is coupled to a first decoupling capacitor C2 and a source terminal that is coupled to a second decoupling capacitor C3. Transistor 222 connected in this way is sometimes referred to as a "source follower" transistor. The voltage at the source terminal of transistor 222 will generally track or "follow" any change in voltage at the gate terminal of transistor 222.

The source terminal of transistor 222 may be coupled to a power supply terminal of ring oscillator 208. Ring oscillator 208 may include multiple inverting circuits connected in a ring. Configured as such, a higher voltage level at the source terminal of transistor 222 will generally translate to ring oscillator 208 generating a periodic signal at a higher frequency, whereas a lower voltage level at the source terminal of transistor 222 will generally translate to ring oscillator 208 generating a periodic signal at a relatively lower frequency (e.g., variable oscillator 208 may output a periodic signal OUT having a frequency that is dependent on voltage Vctr). The output of ring oscillator 208 may serve as the output of PLL 108 at which PLL output signal outclk may be provided.

Output signal outclk generated by ring oscillator 208 may be fed to frequency divider 210 to generate feedback signal fbclk. Divider 210 can be used to divide the variable oscillator output signal by an appropriate integer (e.g., by two, by three, by five, etc.). Divider 210 may contain programmable elements (now shown), so that the integer setting of the divider may be adjusted. If desired, divider 210 may implement a non-integer division as well. For example, sigma-delta modulation methods of oscillating between two integer values may be used to generate a non-integer divisor.

The amount by which divider 210 divides the oscillator output signal determines the ratio between the frequency of signal refclk and signal outclk. For example, signal refclk may have a given frequency, whereas signal outclk may be a locked output clock signal having a frequency that is N times the given frequency. In a typical scenario, the frequency of signal refclk might be 500 MHz and the frequency of signal outclk might be 2 GHz (as an example).

As described above, a PLL generally has fairly limited control on the availability of the input reference signal refclk or on the availability of feedback signal fbclk. For example, either signals refclk or fbclk may stop toggling if there is an unexpected interruption at the reference oscillator or some inadvertent gating in the feedback path. Such scenarios are sometimes referred to as a "clock loss" event. During a clock loss event, the phase frequency detector may continuously assert signal UP, which results in voltage Vctr rising too high, or may continuously assert signal DN, which results in voltage Vctr falling too low. If voltage Vctr is too low, transistor 222 in the source follower circuit may become electrically overstressed (e.g., the drain-to-gate voltage drop may be greater than desired and can cause reliability issues). If voltage Vctr is too high, the ring oscillator may also be exposed to too much stress since the source of transistor 222 will track the voltage Vctrl (e.g., the source voltage may be greater than desired and can damage any transistor connected to that source terminal).

In accordance with an embodiment, PLL 108 may be provided with a control circuit such as PLL control block 250. As shown in FIG. 2, PLL control block 250 may that a first input that receives signal refclk, a second input that receives signal fbclk, a third input that receives an sampling clock signal such as signal slowclk (e.g., a free-running clock from another oscillator that is used to continuously sample signal refclk and signal fbclk), a first output on which output refclkloss is generated, a second output on which output fbclkloss is generated, and a third output on which output clkloss* is generated. Signal slowclk may have a lower frequency than either signal refclk or signal fbclk to help reduce power and minimize power noise. As an example, signal slowclk may have a frequency of 10 MHz or less.

Control block 250 may assert signal refclkloss in response to detecting that signal refclk has stopped toggling. Control block 250 may assert signal fbclkloss in response to determining that signal fbclk has stopped toggling. Signals refclkloss and fbclkloss may be fed to the core logic within integrated circuit 100 for user debugging purposes (as an example). Overall clock loss signal clkloss* will be asserted if either signal refclkloss or signal fbclkloss is asserted.

Signal clkloss* generated in this way may be used to disable phase frequency detector 200 and to drive voltage Vctr to a predetermined bias voltage level Vbias. Still referring to FIG. 2, phase frequency detector 200 may also have an enable-bar (enb) input that receives signal clkloss* and a switch such as switch 224 that is coupled between the gate of transistor 22 and bias voltage line 226 (e.g., line 226 on which predetermined bias voltage Vbias is provided). When signal clkloss* is deasserted or low, phase frequency detector 200 may be active. When signal clkloss is asserted or high, phase frequency detector 200 may be deactivated so that charge pump 202 is placed in a tristate mode (e.g., both the up/down signals will be deasserted). When charge pump 202 is tristated, charge pump 202 will no longer be actively driving voltage Vctr. As a result, voltage Vctr can be driven to voltage level Vbias when switch 224 is closed.

Voltage level Vbias may represent a fixed bias voltage level that prevents transistors 222 from becoming electrically overstressed. For example, consider a scenario in which the ground power supply voltage Vss is at 0 V and the positive power supply voltage Vcc is at 1.8. In such a scenario, it may be desirable to fix voltage Vbias at 0.7 V. This is merely illustrative. In other suitable arrangements, voltage Vbias may be set to 0.6 V or less, 0.8 V or more, or other suitable intermediate voltage level between Vss and Vcc for minimizing voltage overstress at source follower transistor 222 during a clock loss event. Arranged in this way, transistor 222 need not be implemented using a thick gate oxide transistor and may be protected from electrical overstress (i.e., transistor 222 may be formed using a thin gate oxide like the rest of the transistors within the PLL).

Figure 3:
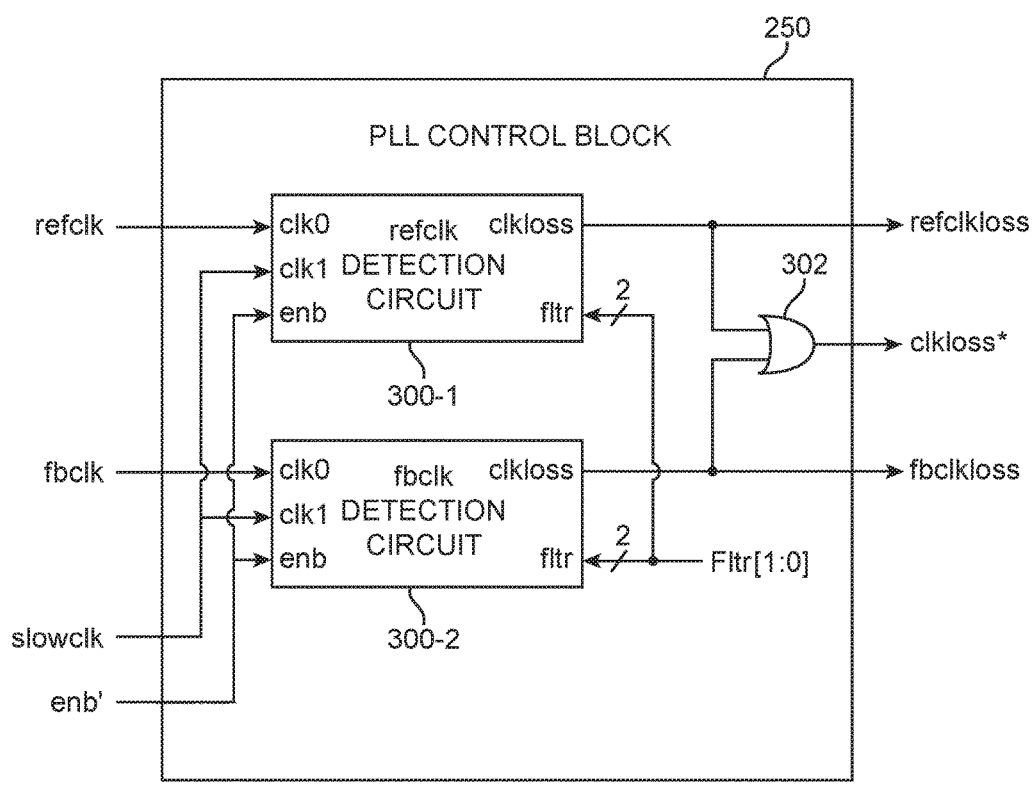
FIG. 3 is a diagram of an exemplary PLL control block with two identical clock loss detector circuits in accordance with an embodiment.

FIG. 3 is a diagram of PLL control block 250. As shown in FIG. 3, PLL control block 250 may include a first clock loss detection circuit such as refclk detection circuit 300-1 and a second clock loss detection circuit such as fbclk detection circuit 300-2. Detection circuits 300-1 and 300-2 may be structurally identical to each other. Detection circuit 300-1 may be used to determine when signal refclk has stopped toggling, whereas detection circuit 300-2 may be used to determine when signal fbclk has stopped toggling.

Each of detection circuits 300 may include a first clock input (clk0), a second clock input (clk1), an enable-bar (enb) input, a filter control (fltr) input, and a clock loss output. For example, detection circuit 300-1 may receive signal refclk at its clk0 input, sampling signal slowclk at its clk1 input, signal enb' at its enb input, and filter control bits Fltr[1:0] at its fltr input. Signal enb' may be an additional control signal that can be used to selectively deactivate detection circuit 300-1. Control bits Fltr[1:0] may set the latency for which a clock loss event is detected. For example, if Fltr[1:0] were set to "00," the latency and filtering effect is minimized. On the other hand, if Fltr[1:0] were set to "11," the latency and filtering effect is maximized to ensure that a clock loss event is indeed present. Connected as such, circuit 300-1 may assert signal refclkloss whenever it determines that signal refclk has stopped toggling and has failed to recover within the designated filter latency period.

Similarly, detection circuit 300-2 may receive signal fbclk at its clk0 input, sampling signal slowclk at its clk1 input, signal enb' at its enb input, and filter control bits Fltr[1:0] at its fltr input. Signal enb' may also be used to selectively deactivate detection circuit 300-2. Control bits Fltr[1:0] may set the latency for which a clock loss event at signal fbclk is detected. Configured as such, circuit 300-2 may assert signal fbclkloss whenever it determines that signal fbclk has stopped toggling and has failed to recover within the designated filter latency period. Control bits Fltr includes two bits in this example. This is merely illustrative. In general, filter control Fltr may include any suitable number of bits to meet the desired filtering resolution.

Still referring to FIG. 3, PLL control block 250 may also be provided with a logic gate such as logic OR gate 302. Logic OR gate 302 may have a first input that receives signal refclkloss from the output of first clock loss detection circuit 300-1, a second input that receives signal fbclkloss from the output of second clock loss detection circuit 300-2, and an output on which signal clkloss* is generated. Connected in this way, logic OR gate 302 will assert signal clkloss* whenever at least one of signals refclkloss and fbclkloss is high (e.g., if either signal refclkloss or fbclkloss is asserted, signal clkloss* will be driven to a logic "1"). The example of FIG. 3 in which logic OR gate 302 is used to generate signal clkloss* is merely illustrative. If desired, other types of logic gates or circuits can be used.

Figure 4:
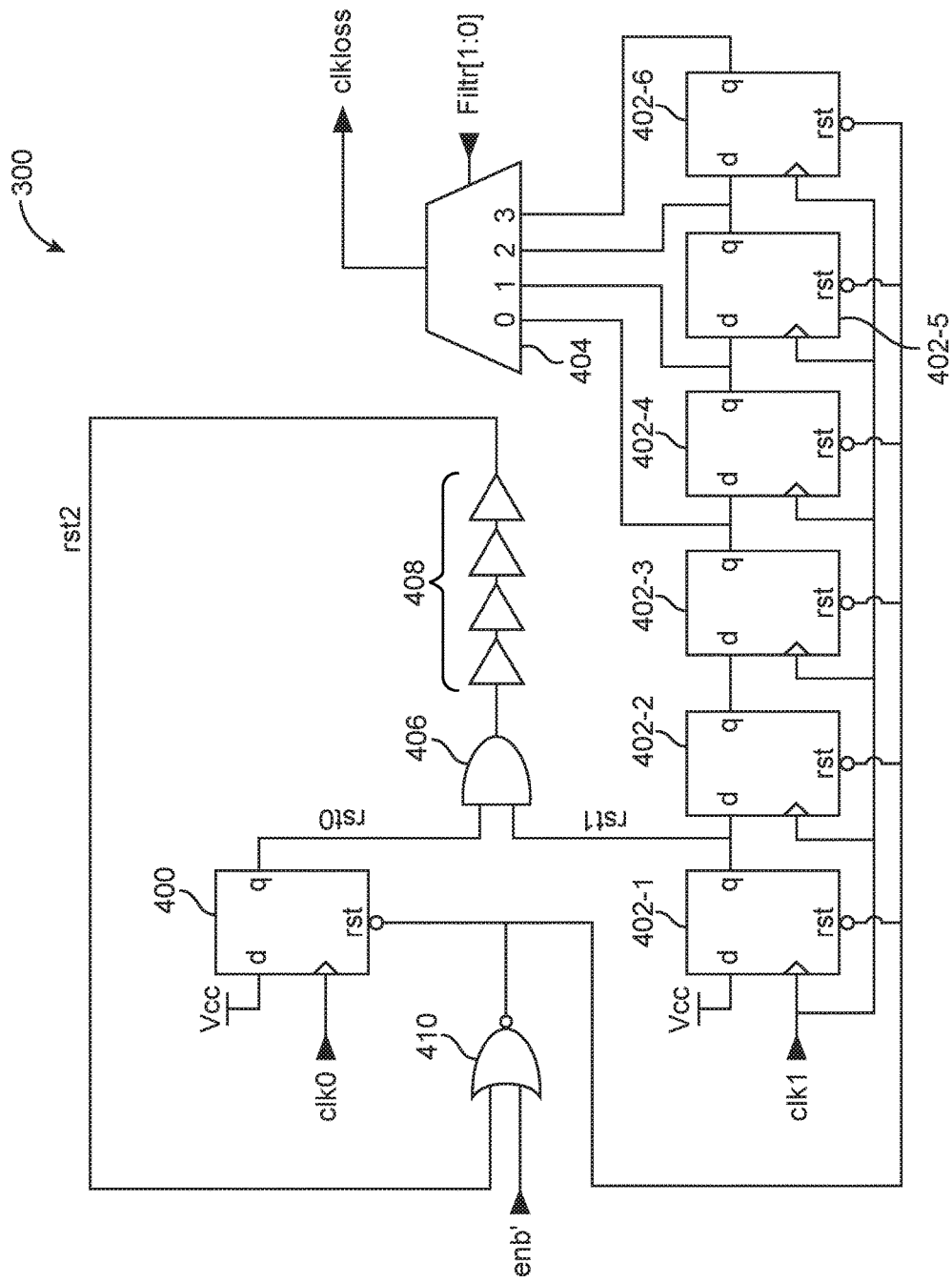
FIG. 4 is a circuit diagram of an illustrative clock loss detector circuit in accordance with an embodiment.

FIG. 4 is a circuit diagram of an illustrative clock loss detector circuit 300 (e.g., circuit 300-1 and circuit 300-2 of FIG. 3) in accordance with an embodiment. As shown in FIG. 4, clock loss detector circuit 300 may include digital flip-flop circuits such as flip-flops 400, 402-1, 402-2, 402-3, 402-4, 402-5, and 402-6, logic gates such as logic NOR gate 410, logic AND gate 406, and buffers 408, and a multiplexing circuit such as multiplexer 404.

Flip-flop 400 may have a data input (d) terminal that always receives positive power supply voltage Vcc, a clock input that receives a clock signal from the clk0 port of circuit 300, an active-low reset terminal, and a data output (q) terminal on which signal rst0 can be generated.

Flip-flops 402-1, 402-2, 402-3, 402-4, 402-5, and 402-6 may be connected in series to form a chain. Leading flip-flop 402-1 may have a data input terminal that always receives positive power supply voltage Vcc and a data output terminal at which signal rst1 can be generated. Each of flip-flops 402 in this chain may have a clock input that receives a clock signal from the clk1 port of circuit 300. Each of flip-flops 402 in the chain may also have an active-low reset terminal. In general, a low voltage at the active-low reset terminal of a flip-flop will force the data output terminal to a logic "0," whereas a high voltage at the active-low reset terminal will allow the flip-flop to operate normally.

Logic AND gate 406 may have a first input terminal that receives signal rst0 from flip-flop 400, a second input terminal that receives signal rst1 from flip-flop 402-1, and an output at which a combined reset signal such as signal rst2 is produced. Combined reset signal rst2 may be fed to logic NOR gate 410 via a chain of buffers 408. The use of buffers 408 may serve to introduce a predetermined amount of delay and is optional. In particular, logic NOR gate 410 may have a first input that receives signal rst2 from logic AND gate 406, a second input that receives an enable signal from the enb' port of circuit 300, and an output port that is connected to the active-low reset terminals of each digital flip-flop (e.g., flip-flop 400 and all six flip-flops 402) within circuit 300. The signal at the enb' port can be driven high to disable circuit 300 or may be driven low to activate circuit 300.

In the example of FIG. 4, multiplexer 404 may be a 4:1 multiplexer having a first (0) input that is connected to the data output terminal of flip-flop 402-3, a second (1) input that is connected to the data output terminal of flip-flop 402-4, a third (2) input that is connected to the data output terminal of flip-flop 402-5, a fourth (3) input that is connected to the data output terminal of flip-flop 402-6, a control input that receives control bits Fltr[1:0], and an output at which a corresponding clock loss output signal is generated (e.g., multiplexer 404 may have inputs connected to different locations along the chain of flip-flops 402).

Consider a scenario in which the clk0 port receives signal refclk and in which the clk1 port receives signal slowclk (see, e.g., clock loss detection circuit 300-1 of FIG. 3). Connected in the arrangement shown in FIG. 4, flip-flops 400 and 402-1 will constantly be generating reset pulses at their data output terminals as long as clock signals refclk and slowclk continue to toggle. For example, signals rst0 and rst1 will be driven high following a positive clock edge of signal refclk and signal slowclk, respectively, which will assert combined signal rst2 after some delay through buffers 408 and thereby force both signals rst0 and rst1 back down to ground to complete a pulse.

However, as soon as signal refclk stops toggling, signal slowclk will start to sample logic ones onto the flip-flop chain. When N successive logic ones are successively sampled, where N is the setting defined by Fltr[1:0], the output signal refclkloss will be asserted at the output of multiplexer 404 to serve as an indicator to the PLL that the reference clock has stopped toggling. For example, if bits Fltr[1:0] were set to "00," circuit 300 may be configured to wait for two clock periods of signal slowclk following a clock loss event before asserting the clock loss output. If bits Fltr[1:0] were set to "01," circuit 300 may be configured to wait for three slowclk periods following a clock loss event before asserting the clock loss output. If bits Fltr[1:0] were set to "10," circuit 300 may be configured to wait for four slowclk periods following a clock loss event before asserting the clock loss output. If bits Fltr[1:0] were set to "11," circuit 300 may be configured to wait for five slowclk periods following a clock loss event before asserting the clock loss output. In general, circuit 300 may be adapted to perform any amount of filtering by expanding or shrinking the length of the flip-flop chain and the size of multiplexer 404.

The operation of feedback clock loss detector 300-2 is similar to the scheme describe above except the clk0 port monitors signal fbclk instead of signal refclk.

Figure 5:
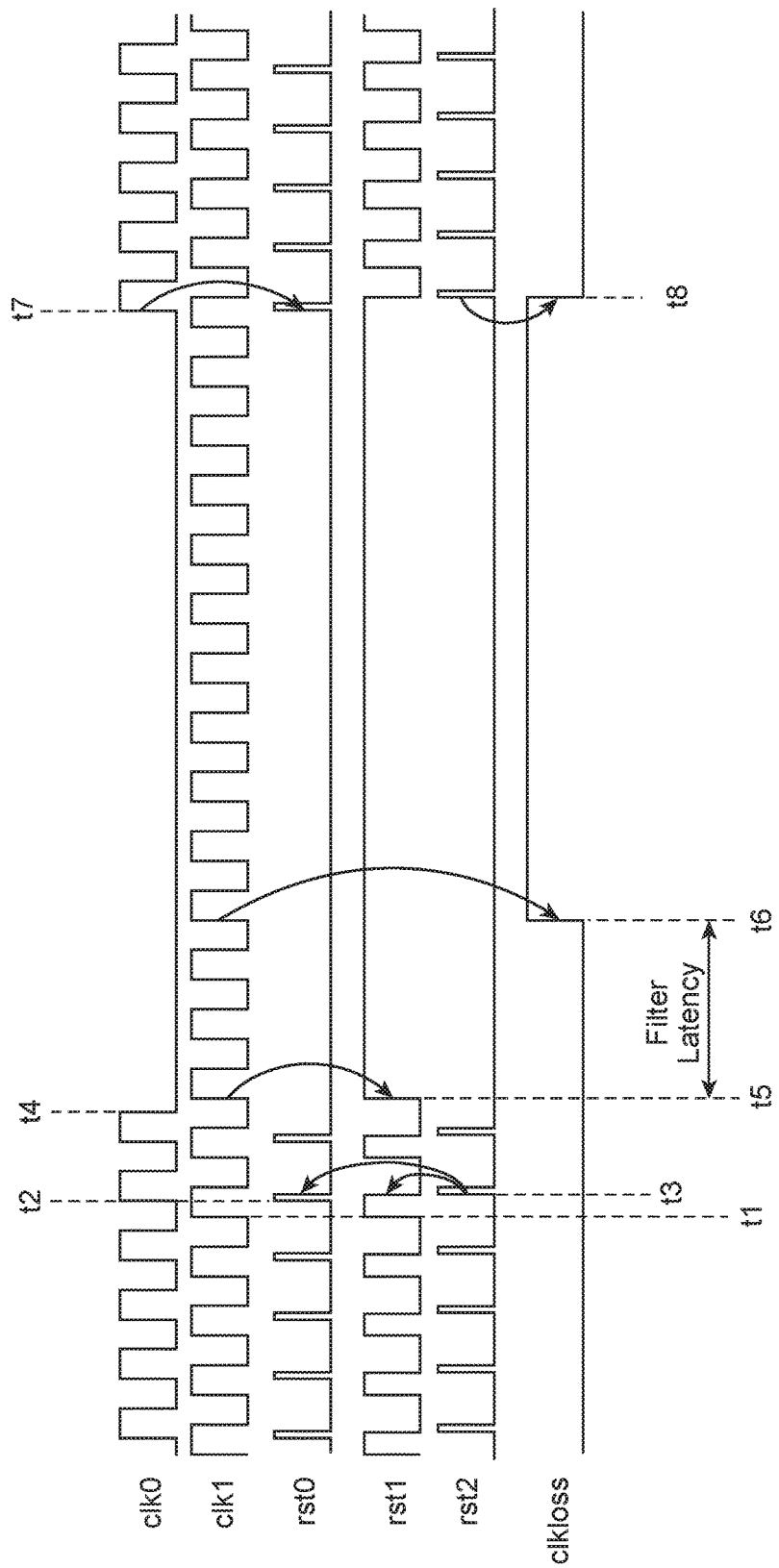
FIG. 5 is a timing diagram illustrating the operation of the clock loss detector circuit shown in FIG. 4 in accordance with an embodiment.

FIG. 5 is a timing diagram illustrating the operation of clock loss detector circuit 300 that is shown in FIG. 4. The example of FIG. 5 shows a scenario in which the clk0 signal (e.g., signal refclk or signal fbclk) and the clk1 signal (e.g., signal slowclk) are running at approximately the same frequency. This is merely illustrative. If desired, the clk1 signal may run slower than the clk0 signal.

A rising clock edge of the clk1 signal (e.g., at time t1) will assert signal rst1. At time t2, a rising clock edge of the clk0 signal will assert signal rst0. At this time, since both signals rst0 and rst1 are high, combined signal rst2 will be driven high (at time t3). In response to signal rst2 being asserted, logic NOR gate 410 will pass a low signal to the active-low reset terminals of each flip-flop in circuit 300 and as a result, both signals rst0 and rst1 will be reset back down to ground. This type of behavior may iterate until a clock loss event occurs.

At time t4, the clk0 signal may stop toggling. This allows signal rst1 to be driven high by the next rising edge of the clk1 signal and to remain high since signal rst0 stays low if there is no subsequent rising edge at the clk0 port. After N clock cycles of the clk1 signal (as set by the filter latency control bits), signal clkloss may be asserted at time t6. In this particular example, bits Fltr[1:0] may be set to "01" since there is a three clock cycle delay following the rising edge of signal rst1.

The signals may persist in these states until the clk0 signal recovers. At time t7, the clk0 signal may begin toggling again. This causes signal rst0 to be asserted, which results in signal rst2 being pulsed high. Whenever combined signal rst2 is driven high, the state of all the flip-flops in circuit 300 will be reset to zero, so output signal clkloss will also be deasserted (at time t8).

Figure 6:
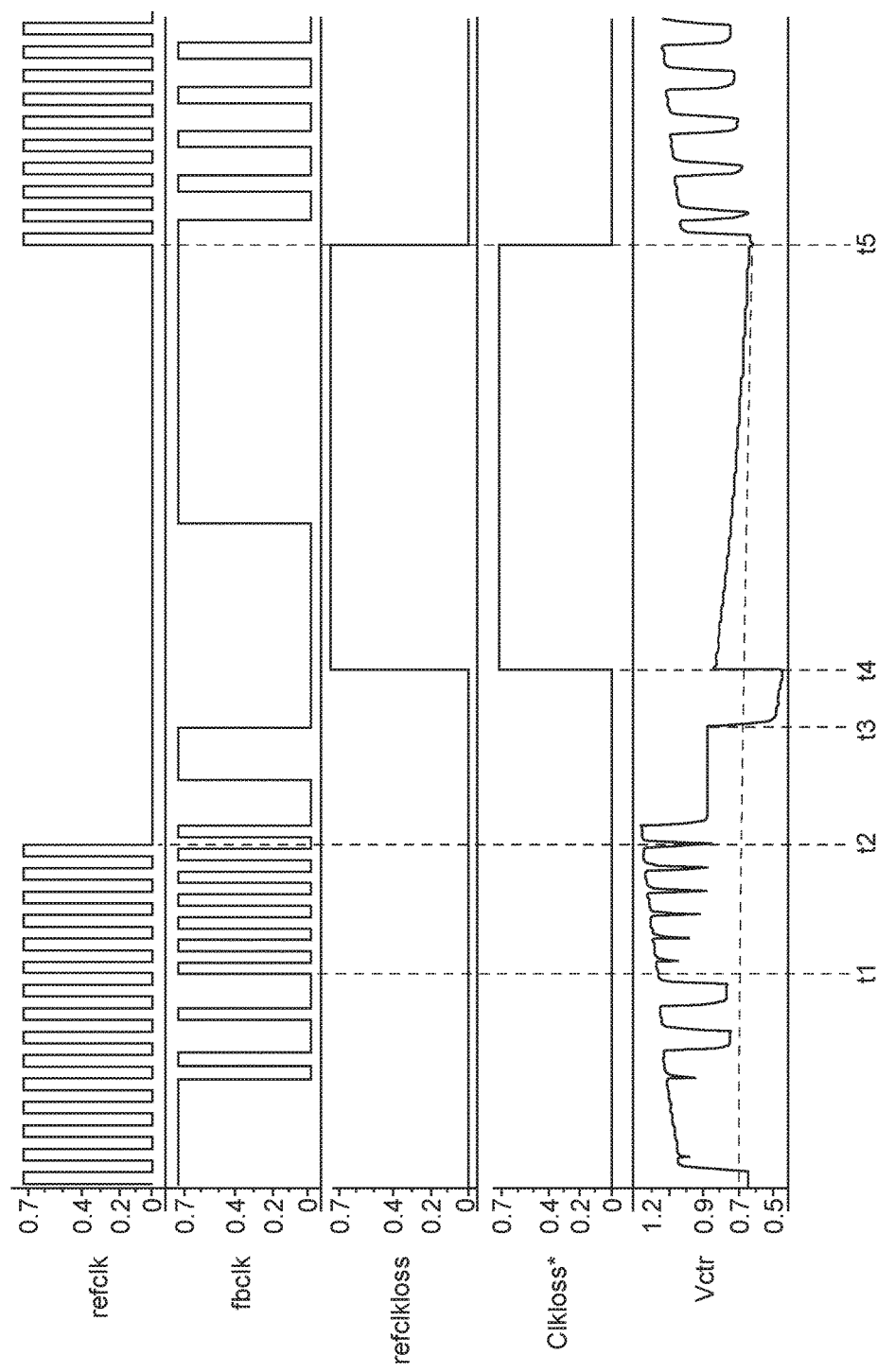
FIG. 6 is a timing diagram illustrating the operation of a PLL of the type shown in connection with FIGS. 2-5 in accordance with an embodiment.

FIG. 6 is a timing diagram illustrating the operation of a PLL of the type shown in connection with FIGS. 2-5 in accordance with an embodiment. Prior to time t1, signals refclk and fbclk are not yet locked, as shown by the uneven frequency of signal fbclk. At time t1, signal fbclk is locked to signal refclk (e.g., signals refclk and fbclk are substantially phase and frequency aligned).

At time t2, signal refclk may stop toggling. This will also throw signal fbclk out of sync. During a clock loss event, phase frequency detector may continuously assert either signal up or down. At time t3, the DN output may be asserted such that charge pump 202 pulls voltage Vctr to less than 0.7 V (as an example).

At time t4, clock loss detector circuit 300-1 may detect the clock loss event and assert signal refclkloss, which will assert control signal clkloss* at the output of PLL control block 250. This will deactivate phase frequency detector 200 and place charge pump 202 in a tristate mode. At the same time, switch 224 will be activated to drive voltage Vctr to a predetermined Vbias voltage level of 0.7 V (as an example).

Applying voltage Vbias to the gate of source follower transistor 222 during a clock loss event prevents transistor 222 from being exposed to overly high or overly low voltage levels that may otherwise be presented at its gate.

At time t5, signal refclk may begin toggling again, signifying the end of the clock loss event. This will cause signals refclkloss and clkloss* to be deasserted. Once signal clkloss* is deasserted, PLL 108 is re-enabled and signal fbclk will eventually be locked to signal refclk so that their phase and frequency are matched.

Figure 7:
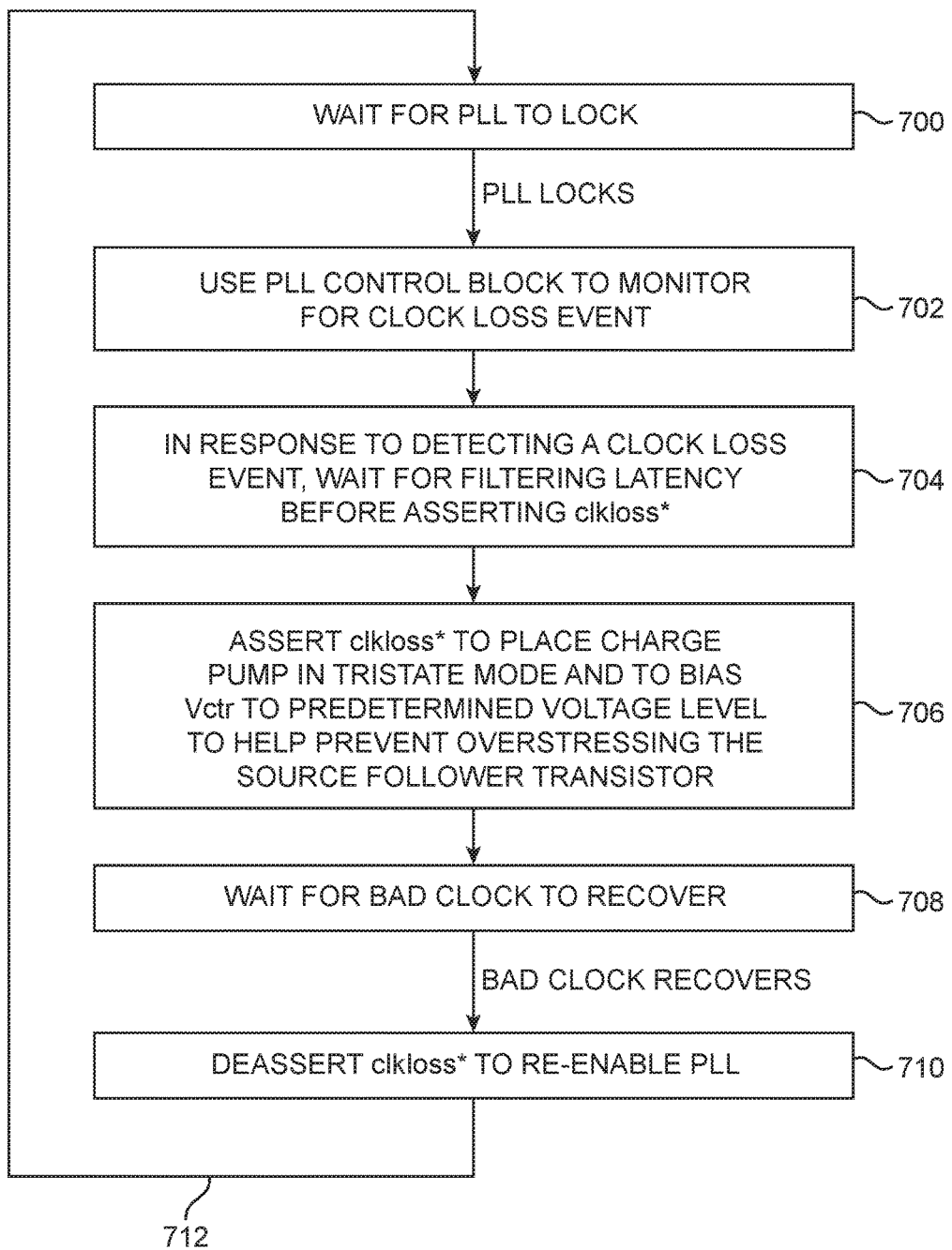
FIG. 7 is a flow chart of illustrative steps for operating a PLL of the type shown in connection with FIGS. 2-6 in accordance with an embodiment.

FIG. 7 is a flow chart of illustrative steps for operating a PLL of the type shown in connection with FIGS. 2-6 in accordance with an embodiment. At step 700, as soon as PLL 108 is enabled, PLL control block 250 may then be used to monitor for a clock loss event (e.g., to determine when signal refclk or signal fbclk stops toggling).

In response to detecting a clock loss event, PLL control block 250 may wait for a preset filter latency period before asserting control signal clkloss* (at step 704). For example, if bits Fltr[1:0] were set to "10," the PLL control block may wait for four slowclk periods before asserting signal clkloss*. If bits Fltr[1:0] were set to "01," the PLL control block may wait for three slowclk periods before asserting signal clkloss*.

At step 706, signal clkloss* may be asserted to place charge pump 202 in tristate mode and to bias voltage Vctr to a predetermined voltage level (e.g., 0.7 V) to help prevent the source follower transistor from being overstressed.

At step 708, the PLL control block may wait for the "bad" clock (i.e., the clock that stopped toggling) to recover or begin toggling again. One the bad clock recovers, PLL control block 250 may deassert signal clkloss* to re-enable PLL 108 (at step 710). Processing may then loop back to step 700, as indicated by path 712.

The foregoing is merely illustrative of the principles of this invention and various modifications can be made by those skilled in the art. The foregoing embodiments may be implemented individually or in any combination.

What is claimed is:

1. A phase-locked loop on an integrated circuit die, comprising:
    a phase frequency detector that receives a reference clock signal;
    a variable oscillator that is controlled by the phase frequency detector and that outputs a feedback clock signal to the phase frequency detector;
    a control block that receives the reference clock signal and the feedback clock signal and that selectively deactivates the phase frequency detector;
    a voltage bias line; and
    a switch that is coupled between the voltage bias line and the variable oscillator and that is only turned on while the phase frequency detector is deactivated.

2. The phase-locked loop of claim 1, wherein the control block selectively deactivates the phase frequency detector in response to detecting a clock loss event.

3. The phase-locked loop of claim 1, further comprising:
    a charge pump that is coupled between the phase frequency detector and the variable oscillator and that is placed in a tristate mode when the phase frequency detector is deactivated.

4. The phase-locked loop of claim 3, wherein the charge pump includes a pull-up switch and a pull-down switch that are both turned off while the phase frequency detector is deactivated.

5. The phase-locked loop of claim 1, further comprising:
    a source follower circuit coupled between the phase frequency detector and the variable oscillator.

6. The phase-locked loop of claim 5, wherein the source follower circuit includes a source follower transistor with a gate terminal on which a given voltage is provided, and wherein the given voltage is driven to a predetermined bias voltage level when the phase frequency detector is deactivated.

7. The phase-locked loop of claim 1, wherein the control block is further configured to receive a sampling clock signal in addition to receiving the reference clock signal and the feedback clock signal.

8. A method for operating a phase-locked loop on an integrated circuit, comprising:
    with a phase frequency detector within the phase-locked loop, receiving a reference clock signal;
    with a variable oscillator within the phase-locked loop, outputting a feedback clock signal to the phase frequency detector;
    with a control block within the phase-locked loop, receiving the reference clock signal and the feedback clock signal and selectively deactivating the phase frequency detector in response to detecting that either the reference clock signal has stopped toggling or the feedback clock signal has stopped toggling;
    receiving a sampling clock signal that is different than the reference clock signal and the feedback clock signal at the control block; and
    using the sampling clock signal to sample the reference clock signal and the feedback clock signal.

9. The method of claim 8, further comprising:
    using the control block to monitor for a clock loss event; and
    in response to detecting the clock loss event, waiting for a filter latency period before deactivating the phase frequency detector.

10. The method of claim 8, wherein the phase-locked loop also includes a charge pump, the method further comprising:
    placing the charge pump in a tristate mode when the phase frequency detector is deactivated.

11. The method of claim 10, wherein the phase-locked loop also includes a source follower transistor, the method further comprising:
    using the charge pump to actively drive the source follower transistor while the phase frequency detector is activated; and
    supplying a predetermined bias voltage to the source follower transistor while the phase frequency detector is deactivated and while the charge pump is in the tristate mode.

12. The method of claim 11, further comprising:
    using the source follower transistor to directly control the frequency at which variable oscillator oscillates.

13. Phase-locked loop circuitry, comprising:
    a phase frequency detector;
    a variable oscillator coupled to the phase frequency detector in a loop;
    a source follower transistor interposed in the loop; and
    a control block that selectively applies a predetermined voltage level to the source follower transistor in response to detecting a clock loss event.

14. The phase-locked loop circuitry of claim 13, wherein the phase frequency detector receives a reference clock and a feedback clock, and wherein the control block includes a first clock loss detector circuit that determines when the reference clock has stopped toggling and a second clock loss detector circuit that determines when the feedback clock has stopped toggling.

15. The phase-locked loop circuitry of claim 14, wherein the control block further includes a logic OR gate that receives output signals from the first and second clock loss detector circuits.

16. The phase-locked loop circuitry of claim 14, wherein the first clock loss detector circuit includes a single flip-flop for generating first reset pulses corresponding to rising edges in the reference clock and a chain of flip-flops for generating second reset pulses corresponding to rising edges in a sampling clock that is different than the reference clock and the feedback clock.

17. The phase-locked loop circuitry of claim 16, wherein the first clock loss detector circuit further includes a multiplexer having inputs connected to different locations along the chain of flip-flops.

* * * * *